United States Patent [19]

DuBrucq

[11] Patent Number: 5,124,508
[45] Date of Patent: Jun. 23, 1992

[54] APPLICATION OF SHEET BATTERIES AS SUPPORT BASE FOR ELECTRONIC CIRCUITS

[75] Inventor: Denyse DuBrucq, West Allis, Wis.

[73] Assignee: The Scabbard Corp., West Allis, Wis.

[21] Appl. No.: 567,194

[22] Filed: Aug. 14, 1990

[51] Int. Cl.⁵ .................................................. H05K 1/00
[52] U.S. Cl. ..................................... 174/260; 174/250; 174/255; 429/81; 429/124; 429/191
[58] Field of Search ................ 174/250, 255, 260; 429/8, 124, 127, 191, 192

[56] References Cited

U.S. PATENT DOCUMENTS

| 2,933,547 | 4/1960 | Grubb, Jr. ...................... 429/192 X |
| 3,674,562 | 7/1972 | Schneider et al. ................... 429/192 |
| 4,030,001 | 6/1977 | Medley, Jr. et al. ................ 361/401 |
| 4,041,514 | 8/1977 | Johnson ........................... 354/288 E |
| 4,109,296 | 8/1978 | Rostek et al. ..................... 361/401 |
| 4,303,748 | 12/1981 | Armand et al. ..................... 429/192 |
| 4,511,796 | 4/1985 | Aigo ............................... 361/401 X |
| 4,576,883 | 3/1986 | Hope et al. . |
| 4,719,384 | 1/1988 | Hauden et al. ...................... 361/401 |
| 4,732,446 | 3/1988 | Gipson et al. ...................... 361/401 |
| 4,737,422 | 4/1988 | Knight et al. ...................... 429/192 |
| 4,749,875 | 7/1988 | Hara ............................... 307/150 |
| 4,755,910 | 7/1988 | Val ................................. 361/401 |
| 4,777,563 | 10/1988 | Teraoka et al. ..................... 361/395 |
| 4,789,610 | 12/1988 | Kondo et al. ...................... 429/218 X |
| 4,794,059 | 12/1988 | Hope et al. . |
| 4,925,752 | 5/1990 | Fauteux et al. ................... 429/192 X |
| 4,960,655 | 10/1990 | Hope et al. . |

FOREIGN PATENT DOCUMENTS

| 2330766 | 1/1975 | Fed. Rep. of Germany ... 354/288 E |
| 119066 | 5/1990 | Japan . |
| 121383 | 5/1990 | Japan . |
| 121384 | 5/1990 | Japan . |
| 121385 | 5/1990 | Japan . |

Primary Examiner—Leo P. Picard
Attorney, Agent, or Firm—Nilles & Nilles

[57] ABSTRACT

Using sheet battery material as a circuit board substrate eliminates the weight and bulk of batteries as a separate circuit component and also eliminates the weight and bulk of fiberglass substrate or flex substrate as printed circuit materials. Insets with wiring built in can give vertical wiring between two or more circuit layers and can support electronic components which have leads connecting wiring on more than one layer of a printed circuit. Connector clips inserted when the connector pins are polarized target connection to power and to ground components of one or more layers of sheet battery. Using these connections between battery substrate components of the structure allows a single power source as A-C or solar to recharge all battery substrate in the electronic component. The effect of application of these discoveries is to reduce the size and mass of the circuit and thus reduce the size and weight of electronic devices from hearing aids and flash lights to portable computers, from video cameras to mini and portable television sets and radios.

16 Claims, 4 Drawing Sheets

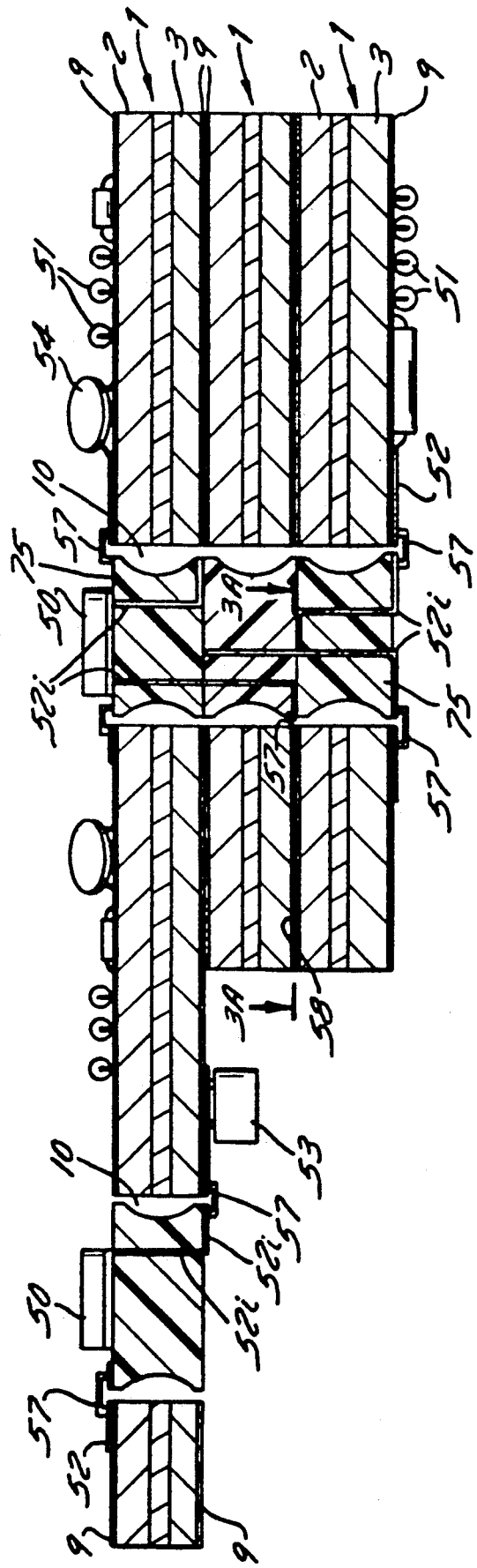
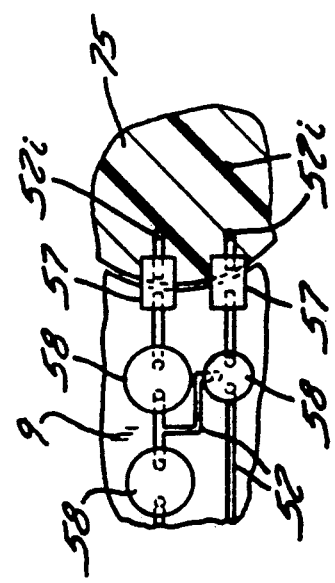
FIG. 3
FIG. 3A

APPLICATION OF SHEET BATTERIES AS SUPPORT BASE FOR ELECTRONIC CIRCUITS

BACKGROUND OF THE INVENTION

The present invention relates to uses of single or laminate layer(s) of sheet battery as the support substrate for the electronic circuitry they power and for the circuitry used to recharge the battery.

Electronic circuits are becoming more compact using surface mounting and flex circuitry techniques. These circuits have for the most part been separate from battery units, power supply and voltage converters.

The size and multiplicity of the sheet battery substrate determines the voltage and current capacities of the power unit. Sheet battery technology has achieved four times the power per unit mass of conventional batteries.

Continuous progress in thin sheet battery or electronic cell development has progressed to reliably rechargeable power units emerging from fabrication in continuous web form. This allows the expansion of its use to circuit substrate for long-term use items needing minimal mass with built-in recharging capabilities.

SUMMARY OF THE INVENTION

It is an object of the present invention to consolidate electronic circuitry by mounting the circuitry on the neutral insulating covering of sheet battery material on one or both sides of the battery unit.

Printed circuit and surface mounting techniques and evaporated circuit techniques are used on both fiberboard and flex circuit films. Applying these to sheet battery substrate gives greater performance per unit mass for electronic circuitry.

It is another object of the invention to laminate the sheet battery substrate making tiers of circuitry and increasing the power component allowing spacing for ventilation if needed.

It is yet another object of the invention to insert circuit bearing plugs in the sheet battery substrate which connect wiring between the surface of circuitry whether on two surfaces per sheet or in a laminate structure of battery substrate.

It is yet another aspect of the invention to use an inner surface wired edge clip with pivoting probe leads, the number equal to the number of laminate layers and spaced to center the pivot at the midpoint of each sheet of battery included, which when put in a direct current (DC) circuit are attracted to either the anode or cathode segment of the sheet battery depending on charge. With probes aligned the clip is driven into the sheet battery substrate anchoring the probes in the anode substrate or the cathode substrate of the sheet(s) of battery. These prongs attached to the conductive lining of the clip comprise one lead of the battery unit. A clip applied with the reverse charge comprises the second battery lead.

The above technique allows ease of assembly and in field replacement of the battery unit for circuit structures independent of the battery unit.

It is yet another aspect of the invention to apply recharging circuitry to the battery substrate for, for example, solar cell chargers or alternating current (AC) wall current trickle chargers.

It is yet another aspect of the invention to build a functional product using the components of this invention, as, for example, a solar, AC trickle chargeable flashlight adding plug prongs and housing, a surface of solar cells, rocker switches and bulbs enabling use at home and in the wilds.

BRIEF DESCRIPTION OF THE DRAWINGS

FIG. 3 is a cross-section illustration of multiple layers of laminated sheet battery substrates with surface mounted electronics on the outer surfaces and integrated circuit-type electronics, such as evaporated circuitry, on the surface of the middle sheet of the laminated sheet batteries, and inserts accessing all layers.

FIG. 3A is a partial sectional view of the evaporated circuitry on the inner surface of laminated sheet batteries shown at line 3A—3A of FIG. 3.

DESCRIPTION OF THE PREFERRED EMBODIMENTS

Figure 1:
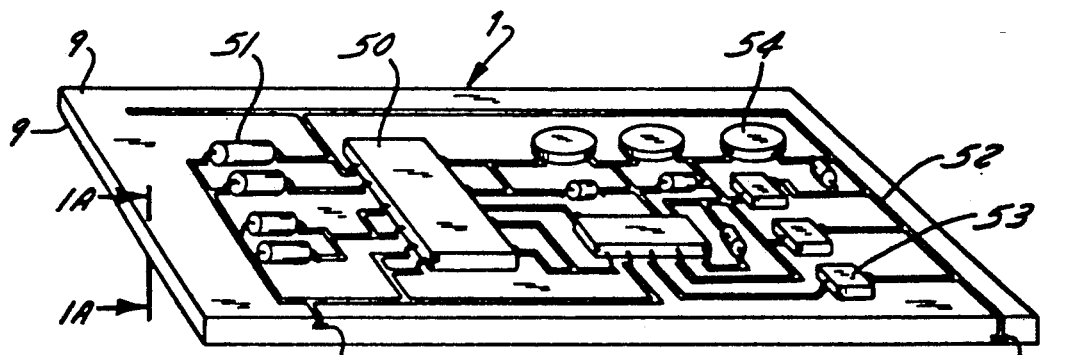
FIG. 1 is a perspective illustration of a printed circuit on a sheet battery substrate using surface mounted electronic assembly with traversing wiring and power and ground access.
Figure 1A:
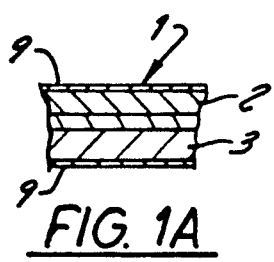
FIG. 1A is a partial cross-sectional view of a sheet battery as seen at line 1A-1A of FIG. 1.

Referring to FIG. 1, circuit with components 50–51, 53–54 and wiring 52 are formed as an integral part of sheet battery 1, as for example, the lithium vanadium rechargeable sheet battery developed by Henry and Steve Hope of Hope Industries, Inc., and described in U.S. Pat. No. 4,576,883 issued Mar. 18, 1986; U.S. Pat. No. 4,794,059 issued Dec. 27, 1988; and U.S. Pat. No. 4,960,655 issued Oct. 2, 1990. Sheet battery components shown in FIG. 1A are comprised of a power layer 2 and a ground layer 3 with an electrolyte therebetween. The top and bottom outer surfaces 9 of the sheet battery are covered with a non-conducting substrate. Surface mounting techniques are used to adhere the components to the surface 9 and the leads are fused to the printed circuit by wave soldering and use of adhesives. Power 2 and ground 3 from the sheet battery are accessed using inserts from wiring 52.

Figure 2A:
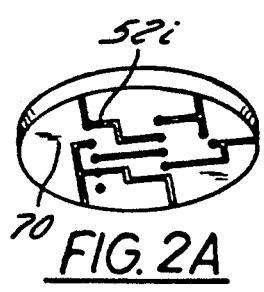
FIG. 2A is a perspective illustration of the underside of the raised insert shown in FIG. 2.
Figure 2B:
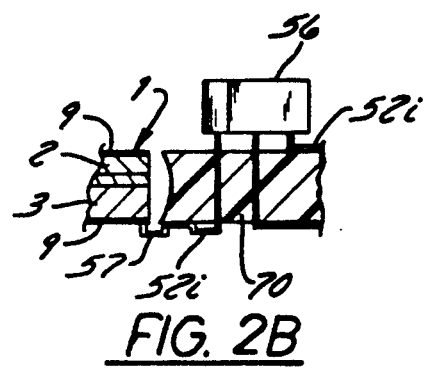
FIG. 2B is a partial cross-sectional view of the insert shown at line 2A—2A of FIG. 2.
Figure 2:
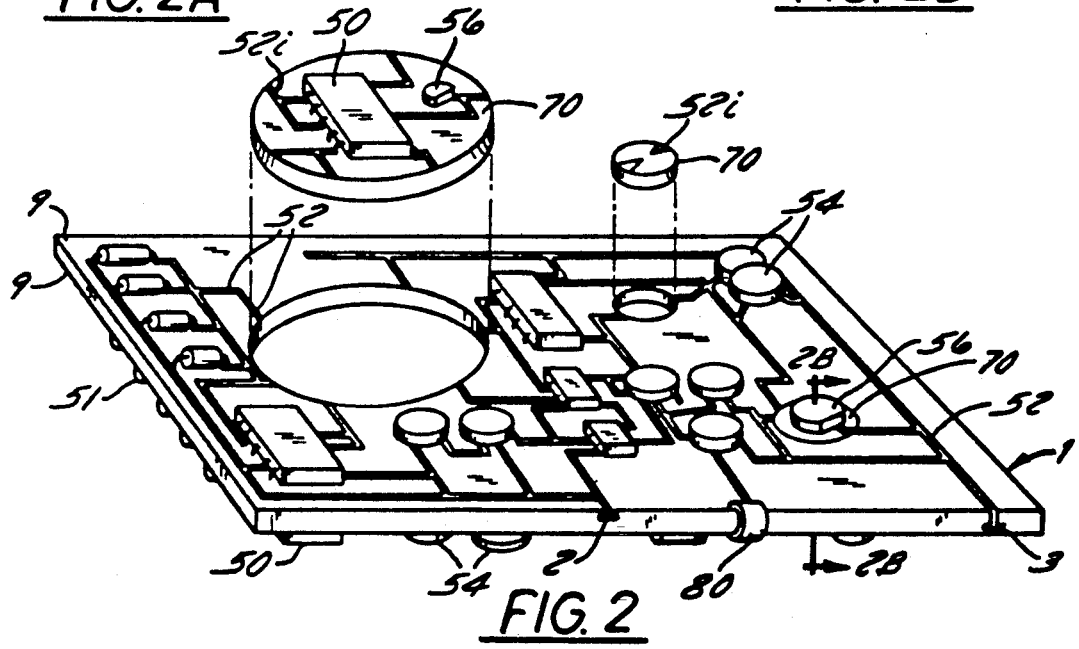
FIG. 2 is a perspective illustration of a printed circuit with surface mounted components on both surfaces of the sheet battery substrate and conventional mounted components on inserts accessing the circuit wiring on both surfaces.

Referring to FIG. 2, battery sheet 1 has circuitry on the upper and the lower surfaces 9. Inserts 70 connect the upper and lower surfaces of the sheet battery through wiring 52i. One insert also has the role of mounting location for an integrated circuit chip 50.

Figure 4:
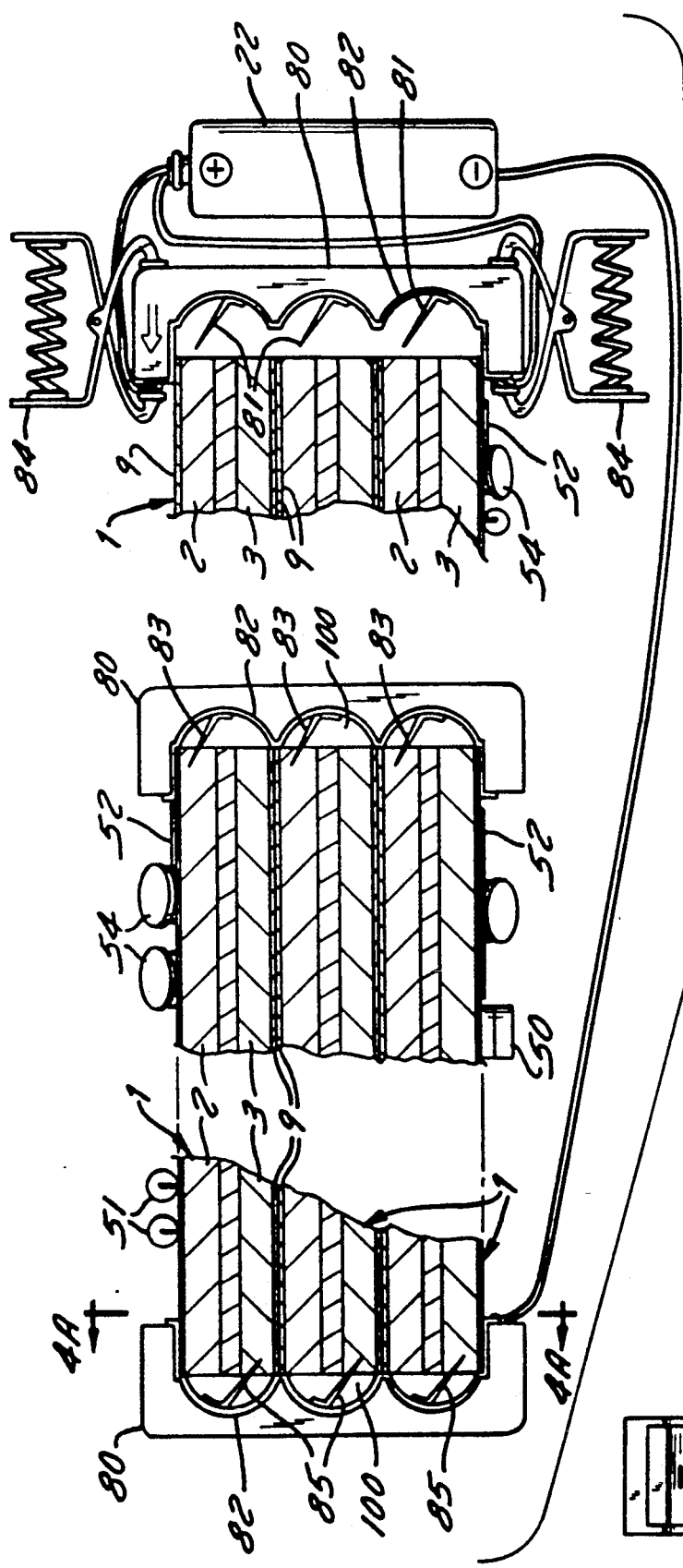
FIG. 4 shows a means of inserting ground and power battery leads into the sheet batteries during fabrication and in repair procedures.
Figure 4A:
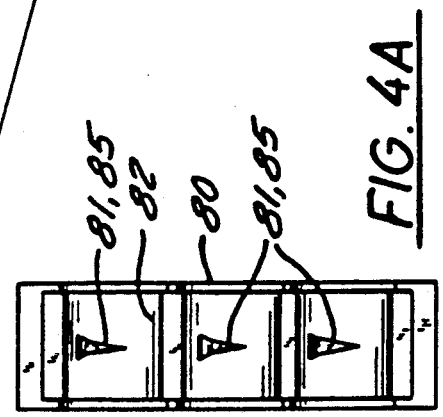
FIG. 4A is a side view of the clip shown at lines 4A—4A in FIG. 4.

Leads 52*i* and connector adhesive 57 connect components 56 to wire 52 on the printed circuit on the upper and lower surfaces of the sheet battery. The two renditions of the larger insert 70 show its upper and lower surfaces. Battery lead connector 80 similar to the connector described in FIG. 4 is used here on a single battery sheet. Battery lead connector 80 houses the power or ground probe 81 shown on edge wiring connections to power 2 and to ground 3, here giving a second ground lead source.

Referring to FIG. 3, we have a laminate of printed circuit or integrated circuit layers of sheet battery 1. Insert 75 made from plastic or other non-conductive material serves the multiple layer structure by feeding out through leads 52*i* at the appropriate layers and in the appropriate directions. Insert 75 can be a single insert or a laminate of single inserts with connector adhesive 57 extending outward making it simple to connect insert wires 52*i* with circuit wires 52. Insert 75 carries on its outer layer integrated circuits or other similar chips which have leads 52*i* feeding components on the various layers. Contact with wiring 52*i* on the inserts 70 and 75 to wiring 52 on sheet battery surface 9 is by wave solder or conductive adhesives 57 or conductor wired flex circuit tape. Concave hollows 10 keep the insert substrate from the battery power 2 and ground 3 substrates. Air pockets or non-conducting plastic can fill these spaces insuring no grounding out of the sheet battery.

Referring to FIG. 4, a means to take advantage of the polarized nature of a common battery 22 in placing the battery connector clips 80, uses leads from the positive end of the common battery 22 to direct connector pins 81 to the power substrate 2 and the negative pole of the common battery 22 to direct connector pins 81 to the ground substrate 3 of sheet battery 1. The auxiliary common battery allows initial setting of leads for a sheet battery stack. These clips handle multiple layers of sheet battery substrate 1. Clips 80 for single sheets of battery sheet 1 as shown in FIG. 2 are made and applied using the same principle.

The battery lead clips 80 have a support substrate lined with a conductive sheet 82 in contact with the lead pins 81. Concave hollows 100 for each layer keep the conductive layer from contacting the power 2 or ground 3 of the battery, but allow contact with the insulating surface 9 of the layers. Clamps 84 from the cathode of the auxiliary common battery 22 to the clip 80 cause the pins 81 to favor the power 2 of the sheet battery. Once the polarity holds the pins 81 in the desired direction, the clip 80 is pushed onto the battery material causing the pins 81 to penetrate the proper layer of the battery substance. Pins 83 and 85 feed into the power 2 and ground 3 of the sheet batteries, respectively.

The choice of circuit construction between the inner and outer layers of the sheet battery defines a preferred rendition of the patent satisfying the inclusion where necessary of mounting individual components on outer surface circuits and reserving the inner surfaces for circuitry that can be rendered using evaporated circuit techniques.

The thickness of the sheet battery intended for use is about 0.02–0.04 inch thick which is not possible to draw with inner definition. The representations here greatly expand the sheet battery's vertical dimension. The hollows 100 are deeper ellipses containing the pin 81. With the design of circuit accommodation for the sheet battery materials in single or multiple layers, the condensation of circuit size is accomplished.

Figure 5:
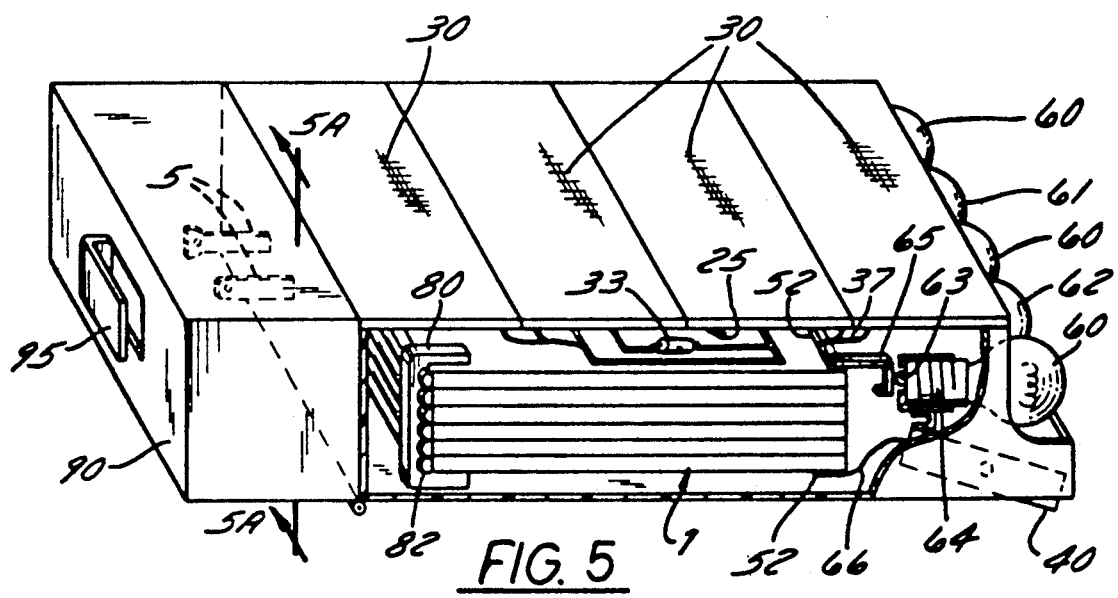
FIG. 5 is a perspective illustration of an AC and solar cell rechargeable flashlight powered by a sheet battery stack highlighting the general structure, light array and AC adapter.

Referring to FIG. 5, a flashlight, with circuit board sheet battery 1 supporting a trickle charge circuit 25 drawing power from plug prongs 5 which take AC wall plug 20 power and feeds the power side with lead 26 and ground with lead 24 which feed into wires 52 of a trickle charging circuit on the sheet battery surface. Alternately, it can use solar cells 30 as long as diode 33 prevents current drain when the cells are not in light inputting charge with power line 37 and ground lead (not shown). Light from the sun or a lamp charges the battery through the solar cell energy absorption. Both charging circuits are common art in the electronics field and solar cells come with recommended circuit schematics.

Figure 5A:
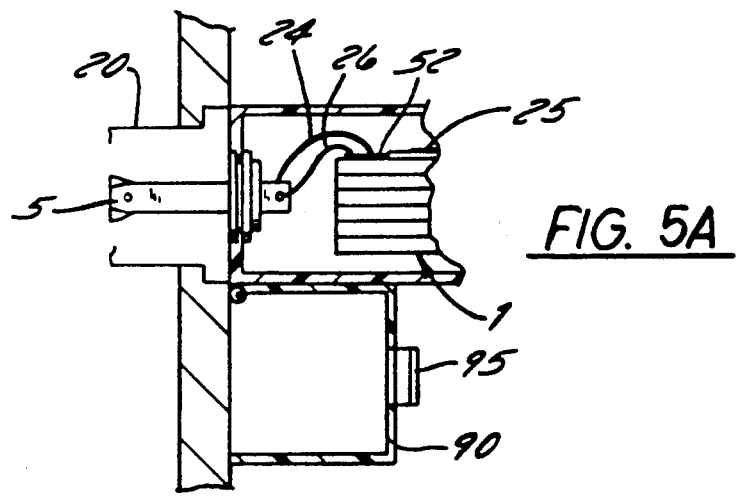
FIG. 5A is a partial cross-section of the AC adapter shown in FIG. 5.
Figure 5B:
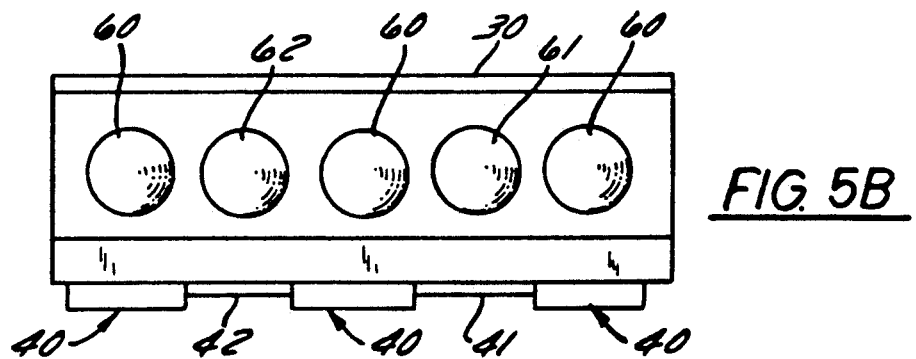
FIG. 5B is a front view of the flashlight shown in FIG. 5.

The flashlight has switches 40 in the on position and switches 41 and 42 in the off position resulting in bulbs 60 being on and bulbs 61 and 62 being off giving a choice of pattern for bulb illumination as shown in FIG. 5B. The power contact 63 and ground contact 64 from bulb 60 has a permanent power wire 65 and a ground wire 66 going through switch 40 here in the on position. These wires meet battery circuit wires 52 to complete the circuit powered from the power and ground clips 80.

Flashlight encasement includes the hinged cover 90 over the plug prongs 5 as shown in FIG. 5A, which contains a handle 95 that can be clipped to for belt or lanyard carrying.

This figure shows a practical application of the sheet battery substrate circuit board design. It includes two means of charging the device both having their circuits on the sheet battery substrate. This simple application gives the basics for using this circuit design for a wide range of applications.

As is shown with the flashlight in FIG. 5, we have eliminated the AC converter by applying a trickle charging circuit which will allow only one direction of current from the AC power source and will slowly charge the battery from the wall plug. Also, the simple accommodation of the solar cell with a single diode 33 allows the excited solar cell to charge the battery, but will not allow the drain of power when it is used or stored in the dark.

Layering of printed circuits, with or without ventilation depending on whether circuit components need cooling, using the power substrate for the support substance gives shorter leads. It allows cutting the substrate to the size needed to produce the voltage and current requirements eliminating power supplies and voltage converters. More complicated circuitry can be developed with vertical leads between layers. Also, with integrated circuit components as well as other similarly complicated electronic chips, the outputs to several circuit components is achieved more directly with multilayer configurations as the sheet battery laminate allows.

These developments make significant differences in the portable electronic equipment market from radios and televisions as well as flashlights and medical assists. The smaller and lighter the component the easier it is to use and handle. With the structural nature of the battery material when laminated, these applications can be made of the material as well, as for instance in applicant's copending applications entitled "Mosaic Monitor for Higher Resolution and Privacy for Audio Accommodations" filed Dec. 29, 1989, Ser. No. 07/459,140, and "Super-CCD With Default Distribution and its Fabrication" filed Sep. 12, 1990, Ser. No. 07/581,503. In a CD disk magazine for a television camera, for example, both the control circuit board and the magazine casement are sheet batteries giving sufficient power in the magazine to record on the contained 100 CD discs. This eliminates the need for a power supply in the camera. Polaroid has achieved this in their film packets having sufficient power in the battery disc to drive the focus and power the flash. The camera takes more power because laser recording is done on the flexible disk substrates. Were lights required to be powered as well, one could recharge the batteries in the casement and circuit board substrates.

For multiple battery applications as described with the CD disk magazine, leads from the circuit board substrate battery to the edges of the structural support battery material are provided using the connector clips for both the power and the ground leads allowing recharging from one source to recharge all the battery components in the entire electronic device.

Application of the circuits to the insulator layer 9 of the sheet battery substrate 1 can be done using several currently employed techniques.

The photo technique of producing printed circuits on circuits board can be used on the sheet battery substrate. This technique includes coating the sheet battery substrate with copper and over the copper coating is either a photographic or silk screen application to areas where wire circuitry is required. Untreated areas are cleared away in a corrosive bath which strips cooper from the surface. The circuits are completed by surface mounting electronic components on the sheet battery substrate surface. In the case of use of the sheet battery, the copper coating would be done leaving uncoated margins which before the corrosive bath are dipped or otherwise coated with resistant material as wax preventing corrosion of the sheet battery substrate. Both sides of the sheet battery substrate can be treated this way in one process.

Another technique used especially in the inner layers of sheet battery laminates is evaporated circuit techniques where a mask or stencil exposes the areas where wiring is desired and it passes through an area where atomic or spattered conductive substance is applied to construct the wiring 52. In additional treatments substance comprising the components 58 are evaporated or spatter applied. This technique is used in integrated circuit construction The inner circuit layer in FIG. 3A shows the appearance of such a circuit greatly enlarged.

Inserts have tiered circuitry with wiring meeting the edge of the insert at any level of battery circuitry laminate with wire continuity provided by flex circuit extension so wire surface touches wire surface between the insert and battery laminate layer circuitry. Similarly the conductive inner surface of the edge clip clamps on circuit wiring.

We claim:

1. A method of constructing an electronic circuit comprising providing a sheet battery having a power layer and a ground layer with their outer surfaces covered by an insulating layer to serve as an electronic circuit substrate, and placing electronic circuitry directly on an outer surface of the sheet battery.

2. The method according to claim 1, further comprising placing electronic circuitry on the other outer surface of the sheet battery.

3. The method according to claim 2, further comprising forming a hole in the sheet battery;
   placing an insert having electronic circuit wiring thereon in the hole;
   matching the wiring on the insert with the electronic circuitry on each surface of the sheet battery and providing contact therebetween.

4. The method according to claim 1, further comprising fusing electronic components to the outer surface of the sheet battery.

5. The method according to claim 4, where the fusing of electronic components to the surface comprises wave soldering.

6. The method according to claim 4, where the fusing of electronic components to the surface comprises applying adhesives.

7. The method according to claim 1, further comprising providing a charging circuit for charging the sheet battery with A-C or solar power, and providing a diode for preventing battery discharge when conditions for charging the battery are not present.

8. The method according to claim 1, further comprising cutting the sheet battery from a web of sheet battery material.

9. A method of constructing an electronic circuit comprising laminating two or more sheet batteries, each sheet battery having a power layer and a ground layer with their outer surfaces covered by an insulating layer to serve as an electronic circuit substrate, and placing electronic circuitry on at least one outer surface of the laminated sheet batteries.

10. The method according to claim 9, further comprising placing electronic circuitry on the two outer surfaces of the laminated sheet batteries.

11. The method according to claim 9, further comprising placing electronic circuitry on a surface of a first sheet battery which is adjacent to a surface of a second laminated sheet battery having no electronic circuitry thereon.

12. The method according to claim 11, further comprising, forming a hole in the laminated sheet batteries;
   placing an insert having electronic circuit wiring thereon in the hole;
   matching the wiring on the insert with the electronic circuitry on each surface of the sheet batteries and providing contact therebetween.

13. The method according to claim 12, further comprising providing electrical contact between the circuit on one surface with the circuit on at least one other surface by placing vertical wiring in the insert.

14. The method according to claim 9, further comprising connecting the laminate battery sheets with clips.

15. The method according to claim 14, further comprising providing the clips with probes and placing the probes on one clip in the power layers, and the probes on another clip in the ground layers, of the laminated sheet batteries, respectively.

16. The method according to claim 15, further comprising polarizing each clip using an external direct current power source such as a battery thereby attracting the probes to either the power layer or the ground layer in the sheet battery, respectively;
   inserting the probes into the power layer or ground layer of the sheet battery by pushing the clip into place thus setting the probes into either the power or ground material of the sheet battery, respectively.

* * * * *